(12) United States Patent
Danny Koh et al.

(10) Patent No.: US 10,325,837 B2
(45) Date of Patent: Jun. 18, 2019

(54) MOLDED SEMICONDUCTOR PACKAGE WITH C-WING AND GULL-WING LEADS

(71) Applicant: Infineon Technologies AG, Neubiberg (DE)

(72) Inventors: Cher Hau Danny Koh, Malacca (MY); Hai Sin Chong, Melaka (MY); Stefan Machiener, Kissing (DE); Yong Chern Poh, Malacca (MY); Toni Salminen, Munich (DE); Khay Chwan Saw, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/805,902

(22) Filed: Nov. 7, 2017

(65) Prior Publication Data

US 2019/0139869 A1    May 9, 2019

(51) Int. Cl.
  *H01L 23/495*  (2006.01)

(52) U.S. Cl.
  CPC .. *H01L 23/49541* (2013.01); *H01L 23/49575* (2013.01)

(58) Field of Classification Search
  CPC ......... H01L 23/49541; H01L 23/49575; H01L 23/49551; H01L 23/49555
  See application file for complete search history.

(56) References Cited

U.S. PATENT DOCUMENTS 8,901,721 B1    12/2014   Bai et al.

*Primary Examiner* — Sonya D. McCall-Shepard
(74) *Attorney, Agent, or Firm* — Murphy, Bilak & Homiller, PLLC

(57) ABSTRACT

A semiconductor package includes a semiconductor die embedded in a molded package body, leads electrically connected to the die and protruding from a side face of the molded package body, and a recess extending inward from the side face and into a bottom main face of the molded package body to form a single groove. The recess begins below a region of the side face from which the leads protrude, so that this region of the side face is flat and each of the leads exits the molded package body in the same plane. A first subset of the leads is bent inward towards the molded package body and seated in the single groove, to form a first row of leads configured for surface mounting. A second subset of the leads extends outward from the molded package body, to form a second row of leads configured for surface mounting.

20 Claims, 5 Drawing Sheets

US 10,325,837 B2

MOLDED SEMICONDUCTOR PACKAGE WITH C-WING AND GULL-WING LEADS

TECHNICAL FIELD

The present application relates to molded semiconductor packages, and particularly to molded semiconductor packages with C-wing leads.

BACKGROUND

Molded semiconductor packages are widely used across many industries as a low-cost packaging solution for semiconductor components. Molded semiconductor packages come in many forms, including leaded and leadless options. Leaded packages have metal leads protruding from the side faces of the molded body. The leads can be shaped like the letter J (so-called J-wing leads), can be gull-wing leads, C-wing leads shaped like the letter C, etc. The leads are typically soldered to a carrier such as a printed circuit board (PCB). With increasing trends in package miniaturization, the metal routing on the carrier for contacting package leads becomes more challenging.

Hence, there is a need for a molded semiconductor package with a more efficient arrangement of leads.

SUMMARY

According to an embodiment of a semiconductor package, the semiconductor package comprises a molded package body having a bottom main face, a top main face and side faces extending from the bottom main face to the top main face, a semiconductor die embedded in the molded package body, a first plurality of leads electrically connected to the semiconductor die and protruding from a first side face of the molded package body; and a first recess extending inward from the first side face of the molded package body and into the bottom main face to form a single groove along the first side face at a bottom of the package. The first recess begins below a region of the first side face from which the first plurality of leads protrudes, so that the region of the first side face from which the first plurality of leads protrudes is flat and all leads of the first plurality of leads exit the molded package body in the same plane. A first subset of the first plurality of leads is bent inward towards the molded package body and seated in the single groove formed by the first recess, to form a first row of leads configured for surface mounting. A second subset of the first plurality of leads extends outward from the molded package body, to form a second row of leads configured for surface mounting.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein provide a molded semiconductor package with a staggered arrangement of C-wing and gull-wing leads at one or more sides of the package, wherein the C-wing leads are bent inward and seated in a single groove formed in each side with leads at the bottom of the molded package body. The C-wing leads form a first row of leads configured for surface mounting, and the gull-wing leads form a second row of leads configured for surface mounting. The spacing between the two rows of different lead types can be selected to reduce the design constraints for the metal routing on the carrier to which the molded semiconductor package is to be attached, allowing for package miniaturization. Also, by staggering the C-wing and gull-wing leads, a smaller molded package body and footprint can be realized, which reduces the cost-per-package and improves process efficiency with higher density/strip processing and testing within the process flow.

Figure 1:
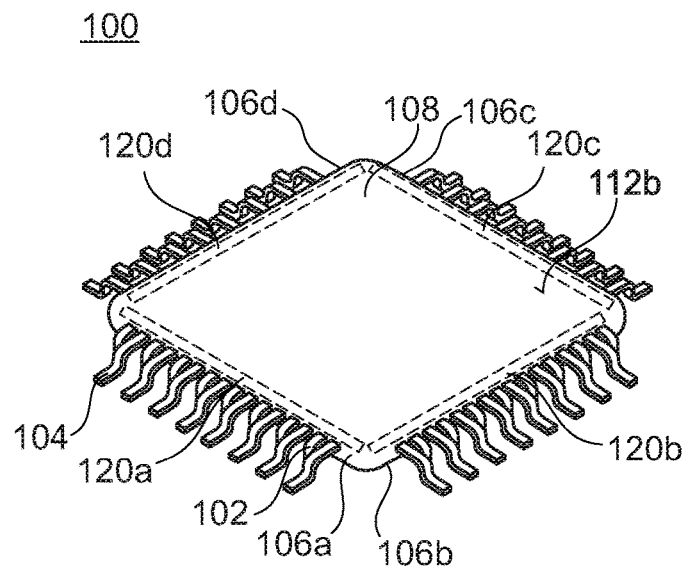
FIG. 1 illustrates a top perspective view of an embodiment of a molded semiconductor package with a staggered arrangement of C-wing and gull-wing leads at one or more sides of the package.

FIG. 1 illustrates a top perspective view of an embodiment of a molded semiconductor package 100 having a staggered arrangement of C-wing leads 102 and gull-wing leads 104, wherein the C-wing leads 102 are bent inward and seated in a single groove 104 formed in each side face 106a-106d of the molded package body 108 at the bottom 110 of the package 100.

Figure 2:
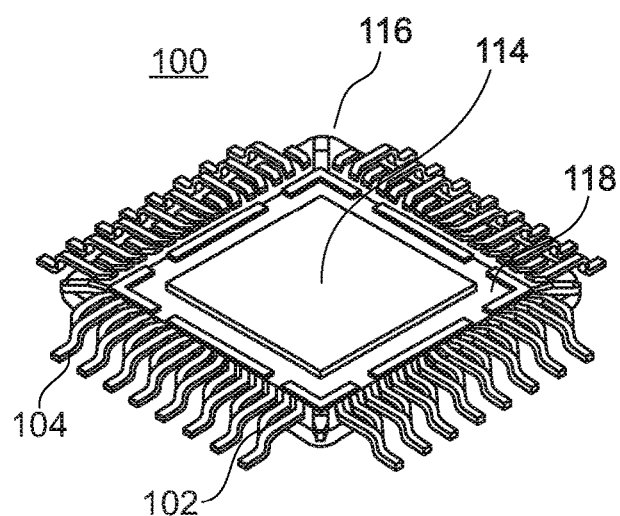
FIG. 2 illustrates a top perspective view of the molded semiconductor package without the molded package body.

FIG. 2 illustrates the molded semiconductor package 100 without the molded package body 108 i.e. before molding.

Figure 3:
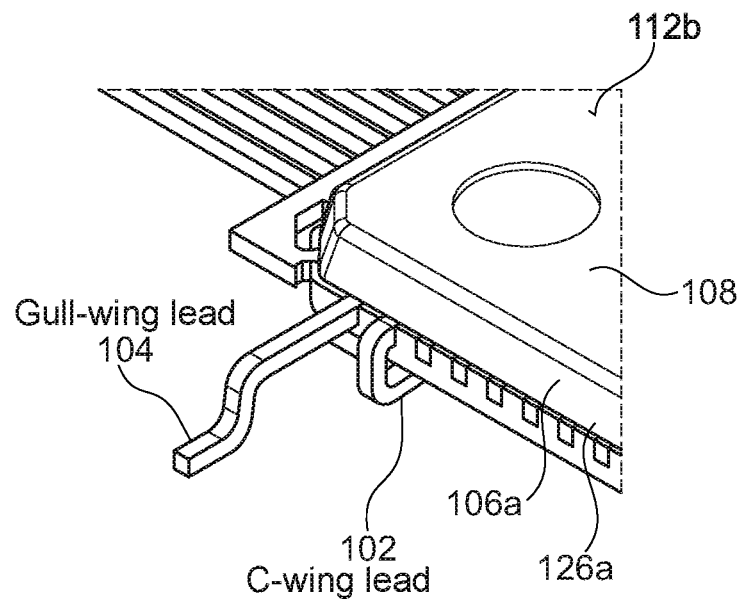
FIG. 3 illustrates a top perspective view of one corner region of the molded semiconductor package 100 during lead processing.

FIG. 3 illustrates a top perspective view of one corner region of the molded semiconductor package 100 during lead processing.

Figure 4:
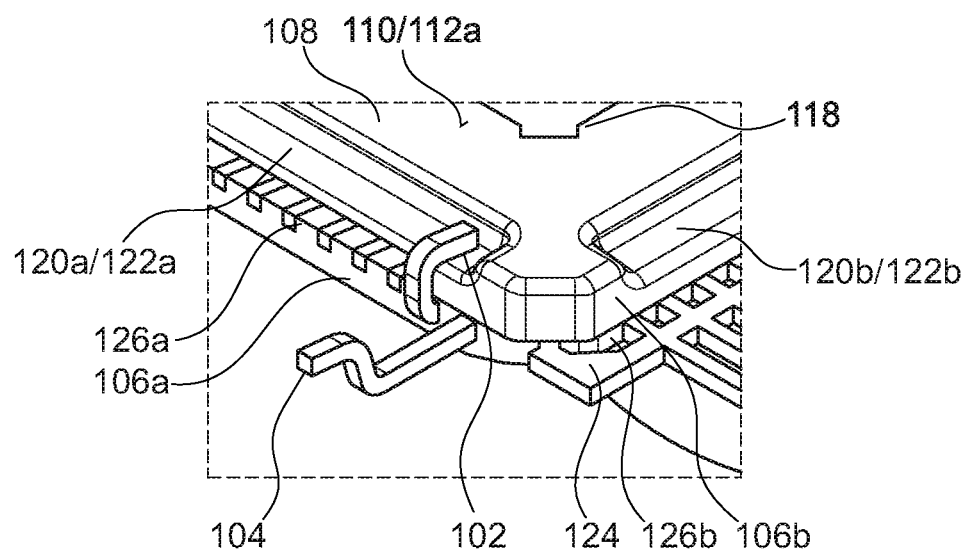
FIG. 4 illustrates a bottom perspective view of the corner region shown in FIG. 3.

FIG. 4 illustrates a bottom perspective view of the corner region shown in FIG. 3.

The molded package body 108 of the molded semiconductor package 100 has a bottom main face 112a, a top main face 112b, and side faces 106a-106d extending from the bottom main face 112a to the top main face 112b. The molded package body 108 can comprise any standard composite materials used for semiconductor package molding such as epoxy resins, phenolic hardeners, silicas, catalysts, pigments, mold release agents, etc. The type of mold compound depends on the type of package, e.g. thick, thin, low-power, high-power, etc. The molded package body 108 can be made by any standard molding method such as injection molding, transfer molding, vacuum forming, etc. The shape and surface features of the molded package body 108 correspond to the design of the mold die or mold cavity used during the molding process.

The molded semiconductor package 100 also includes at least one semiconductor die 114 embedded in the molded package body 108. A single die is shown in FIG. 2 for ease of illustration, however, the molded semiconductor package 100 can include more than one die embedded in the molded package body 108. Some of the semiconductor dies embedded in the molded package body 108 can include one or more power semiconductor devices such as power MOSFETs, IGBTs, BJTs, thyristors, JFETs, diodes, etc. Some of the semiconductor dies 108 embedded in the molded package body can include logic devices such as a processor, controller, ASIC (application-specific integrated circuit), etc. Some of the semiconductor dies 108 embedded in the molded package body can include memory devices such as volatile or non-volatile memory. Some of the semiconductor dies 108 embedded in the molded package body can be passive dies such as capacitor dies and/or inductor dies. Each semiconductor die 108 can be fabricated from any type of semiconductor material such as single element semiconductors (e.g. Si, Ge, etc.), silicon-on-insulator semiconductors, binary semiconductors (e.g. SiC, GaN, GaAs, etc.), ternary semiconductors, etc. with or without epitaxial layer(s).

The C-wing leads 102 and the gull-wing leads 104 are electrically connected to the semiconductor die 108 and protrude from the side faces 106a-106d of the molded package body 108. In some embodiments, leads may not protrude from all side faces 106a-106d of the molded semiconductor package 100. The sixteen leads per side face configuration shown in FIGS. 1-4 is intended as a non-limiting example. In general, any number of C-wing leads 102 and gull-wing leads 104 can protrude from one or more side faces 106a-106d of the molded semiconductor package 100. For example, instead of the 64-lead example shown in FIGS. 1-4, the molded semiconductor package 100 may instead have 48 total leads (24 C-wing leads 102 and gull-wing leads 104), 176 total leads (88 C-wing leads 102 and 88 gull-wing leads 104) or more or less total leads.

The leads 102, 104 can be metal tabs of a leadframe 116. The leadframe 116 also includes a pad 118 to which the semiconductor die 114 is attached. The bottom side of the semiconductor die 114 can form a terminal of the die 114 in the case of a vertical device or, no terminal in the case of a lateral device. Any standard leadframe may be used to realize the die pad 118 and the leads 102, 104. Internal electrical connections between the semiconductor die 114 embedded in the molded package body 108 and the leads 102, 104 can be implemented as wire bonds, metal clips, metal ribbons, etc. The internal electrical connections are not shown in the figures for ease of illustration.

A recess 120a-120d is formed in each respective side face 106a-106d of the molded package body 108 from which the leads 102, 104 protrude. Each recess 120a-1204 extends inward from the corresponding side face 106a-106d of the molded package body 108 and into the bottom main face 112a of the molded package body 108 to form a single groove (notch) 122a-122d along that side face 106a-106d at the bottom 110 of the package 100. Each groove 122a-122d extends the entire length of the side face 106a-106d in which it is formed, except in the corner regions where there are no leads 102, 104. The individual recesses 120a-120d are illustrated with dashed boxes in the top perspective view of FIG. 1, since the recesses recess 120a-120d are hidden in this view. The recesses 120a-120d are not illustrated in FIG. 2, since FIG. 2 shows the molded semiconductor package 100 without the molded package body 108. Respective single grooves 122a, 122b formed in two adjacent side faces 106a, 106b of the molded package body 108 are shown in the corner region illustrated in FIG. 4, and FIG. 3 shows the same corner region but from a top perspective view.

The leads 102, 104 on one side face 106b of the molded package body 108 have yet to be trimmed during this stage of the fabrication process illustrated in FIGS. 3 and 4, and are connected by a tie bar 124 of the leadframe 116. The tie bar 124 is removed in the corner region later in the processing, and the bar 124 is cut between the leads 102, 104. Some of the leads 102, 104 protruding from the adjacent side face 106a of the molded package body 108 are shown as trimmed and flush with the side face 106a. In practice, these leads 102, 104 are not trimmed flush with the side face 106a of the molded package body 108, but instead protrude from the molded package body 108 in an alternating arrangement of C-wing and gull-wing type leads 102, 104 as shown in FIGS. 1 and 2. The leads 102, 104 trimmed flush with the side face 106a in FIGS. 3 and 4 are shown this way only to better illustrate the positioning of an individual C-wing lead 102 in the single groove 112a formed along the corresponding side face 106a of the molded package body 108 at the bottom 110 of the package 100.

Each recess 120a-120d which forms a single groove 122a-122d at the bottom 110 of the package 100 begins below a region 126a-126d of the corresponding side face 106a-106d from which the leads 102, 104 protrude, so that the region 126a-126d of each side face 106a-106d from which a group of leads 102, 104 protrudes is flat and all leads 102, 104 exit the molded package body 108 in the same plane at this side face 106a-106d. The C-wing leads 102 which exit the molded package body 108 at the same side face 106a-106d are bent inward towards the molded package body 108 and seated in the same single groove 122a-122d formed by the recess 120a-120d in that side face 106a-106d, to form a first row of leads configured for surface mounting. The gull-wing leads 104 which are interleaved with the C-wing leads 102 and exit the molded package body 108 at the same side face 106a-106d extend outward from the molded package body 108, to form a second row of leads also configured for surface mounting.

In the embodiment illustrated in FIGS. 1 through 4, groups of interleaved C-wing and gull-wing leads 102, 104 protrude from all side faces 106a-106d of the molded package body 108. Hence, each side face 106a-106d of the molded package body 108 has a recess 120a-120d as described above, which forms a single groove 122a-122d at the bottom 110 of the package 100 for receiving the C-wing leads 102 which protrude from that side face 106a-106d of the molded package body 108. However, also as described above, leads may not protrude from some of the side faces 106a-106d of the molded package body 108. For these molded semiconductor packages, a recess 120x and corresponding single groove 122x are formed along only each side face 106x of the molded package body 108 from which interleaved C-wing and gull-wing leads 102 104 protrude. As such, only the side faces 106a-106d of the molded package body 108 from which a group of leads 102, 104 exits have a single-groove configuration for receiving the corresponding C-wing leads 102. In general, the total number of grooves 122x formed at the bottom 110 of the package 100 corresponds to the number of side faces 106x of the molded package body 108 from which interleaved C-wing and gull-wing leads 102, 104 protrude.

In the embodiment illustrated in FIGS. 1 through 4, a first group of interleaved C-wing and gull-wing leads 102, 104 protrudes from a first side face 106a of the molded package body 108, a second group of interleaved C-wing and gull-wing leads 102, 104 protrudes from a second side face 106b of the molded package body 108 adjacent the first side face 106a, a third group of interleaved C-wing and gull-wing leads 102, 104 protrudes from a third side face 106c of the molded package body 108 adjacent the second side face 106b, and a fourth group of interleaved C-wing and gull-wing leads 102, 104 protrudes from a fourth side face 106d of the molded package body 108 adjacent the third side face 106c at a first end and adjacent the first side face 106a at a second end. All four side faces 106a-106d of the molded package body 108 have a recess 120a-120d extending inward from the corresponding side face 106a-106d and into the bottom main face 112a to form a single groove 122a-122d along that side face 106a-106d at a bottom 110 of the package 100. Each recess 120a-120d begins below the region 126a-126d of the side face 106a-106d from which the corresponding group of leads 102, 104 protrudes, so that this region 126a-126d of the side face 106a-106d is flat and all leads 102, 104 exit the molded package body 108 in the same plane at this side face 106a-106d of the molded package body 108. In each group of leads 102, 104, a first subset of the leads 102, 104 is bent inward towards the molded package body 108 and seated in the single groove 122a-122d formed by the corresponding recess 120a-120d to form a row of C-wing leads 102 configured for surface mounting. A second subset of the leads 102, 104 in each group extends outward from the molded package body 108 and is shaped to form a row of gull-wing leads 104 also configured for surface mounting.

Figure 5:
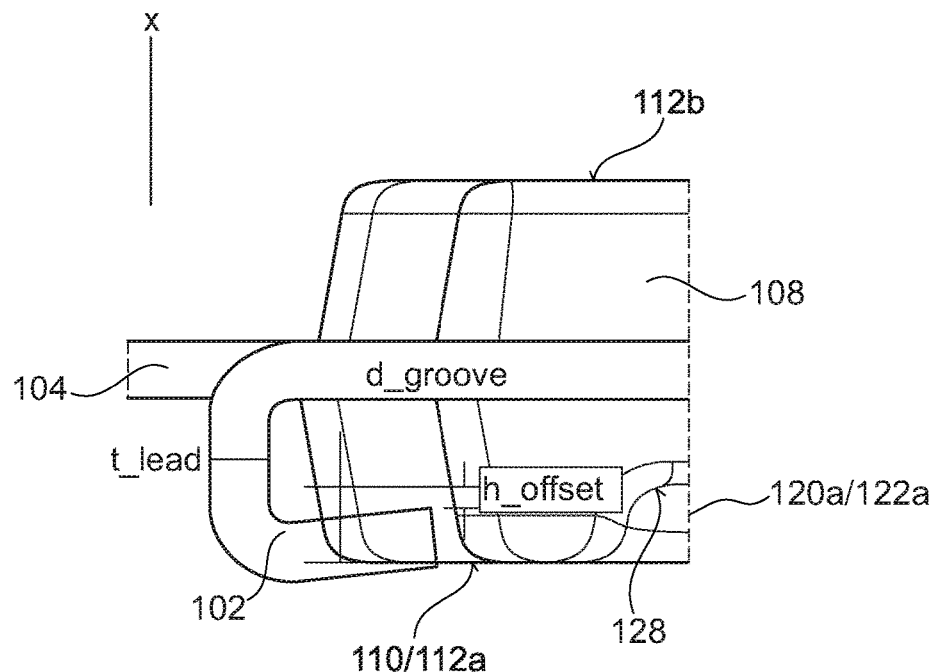
FIG. 5 illustrates a side view of the corner region of the molded semiconductor package shown in FIG. 3.

FIG. 5 illustrates a side view of the corner region of the molded semiconductor package shown in FIG. 3.

Figure 6:
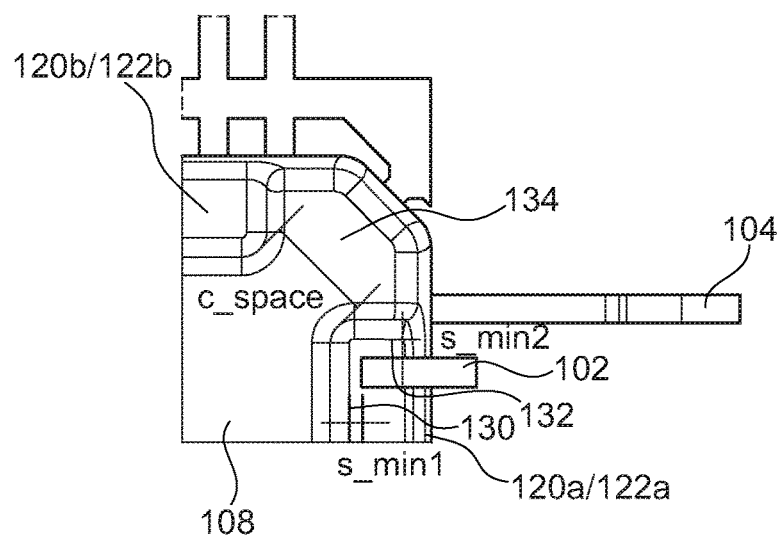
FIG. 6 illustrates a bottom view of the corner region shown in FIG. 3.

FIG. 6 illustrates a bottom view of the corner region shown in FIG. 3.

Each C-wing lead 102 has a defined thickness t_lead, and the single groove 122a-122d in which all C-wing leads 102 protruding from the same side face 106a-106d of the molded package body 108 are seated has a depth d_groove as shown in FIG. 5. The depth d_groove of the single groove 122a-122d is measured in a direction x perpendicular to the bottom main face 112a of the molded package body 108. In one embodiment, the thickness t_lead of the row of C-wing leads 102 seated in the single groove 122a-122d is greater than the depth d_groove of the single groove 122a-122d, so that the row of C-wing leads 102 is not flush with the bottom main face 112a of the molded package body 108 as shown in FIG. 5. According to this embodiment, the bottom of each C-wing lead 102 sticks out (projects) beyond the bottom 110 of the package 100 so as to provide positive standoff for subsequent mounting to a carrier. In addition or alternatively, the row of C-wing leads 102 can be spaced apart from the top main surface 128 of the single groove 122a-122d by a distance h_offset, e.g. of about 0.05 mm or greater. According to this embodiment, the row of C-wing leads 102 is seated in the single groove 122a-122d but does not contact the top main surface 128 of the groove 122a-122d. Alternatively, some or all of the C-wing leads 102 can contact the top main surface 128 of the groove 122a-122d.

The row of C-wing leads 102 seated in the same groove 122a-122d can be spaced apart from the back sidewall 130 of the groove 122a-122d by a minimum distance s_min1, e.g. by about 0.06 mm or greater, as shown in FIG. 6. The two endmost C-wing leads 102 can be spaced apart from the adjacent lateral sidewall 132 of the corresponding groove 122a-122d by a minimum distance s_min2, e.g. by about 0.1 mm or greater, also as shown in FIG. 6.

The recesses 120x, 120y formed in adjacent side faces 106x, 106y of the molded package body 108 can terminate before reaching the corner region 134 of the molded package body 108 which connects the adjacent side faces 106x, 106y, so that the recesses 120x, 120y are separated from one another and the bottom 110 of the package 100 is not recessed in the corner region 134. In one embodiment, the recesses 120a-120d formed in adjacent side faces 106a-106d of the molded package body 108 are spaced apart from one another by a minimum distance c_space of at least 0.5 mm in the connecting corner region 134, as shown in FIG. 6.

Figure 7:
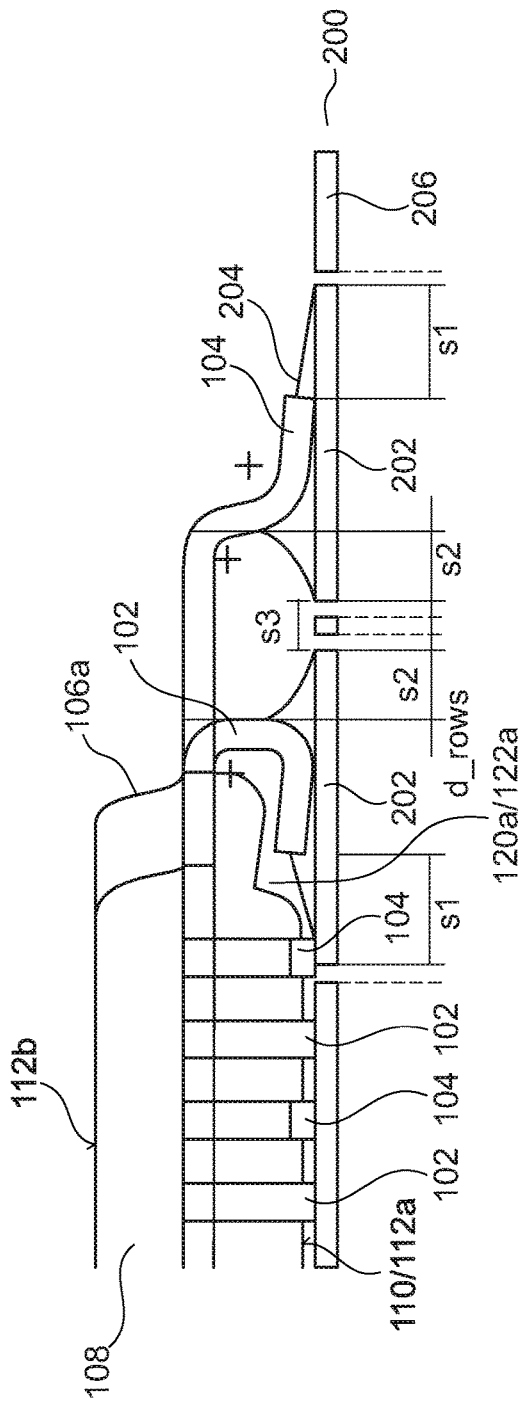
FIG. 7 illustrates a partial side view of the molded semiconductor package after attachment to a carrier.

FIG. 7 illustrates a partial side view of the molded semiconductor package 100 after attachment to a carrier 200 such as a PCB. The carrier 200 includes metal contact areas 202 which are connected to respective leads 102, 104 of the molded semiconductor package 100 by a joining material 204 such as solder, and an insulating layer 206 for separating the metal contact areas 202. Each metal contact area 202 has a total minimum width which accounts for the contact area of the corresponding lead 102/104, and additional minimum space s1, s2 on each side of the lead contact area for accommodating the joining material 204. Adjacent metal contact areas 202 on the carrier 200 are separated by a minimum distance s3. Based on this configuration of the contact area spacings on the carrier 200, the row of C-wing leads 102 and the row of gull-wing leads 104 protruding from the same side face 106a-106d of the molded package body 108 are spaced apart from one another by a minimum distance d_rows=s3+2*s2. In one embodiment, the minimum distance draws between the row of C-wing leads 102 and the row of gull-wing leads 104 protruding from the same side face 106a-106d of the molded package body 108 is at least 0.8 mm.

Figure 8:
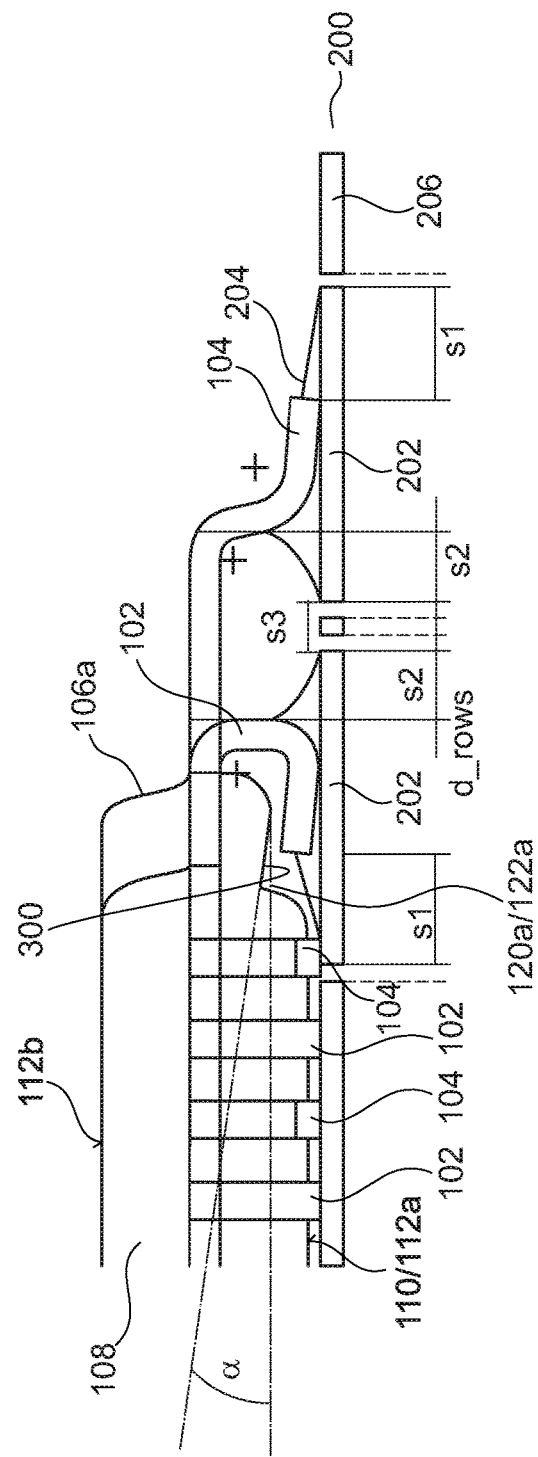
FIG. 8 illustrates a partial side view of the molded semiconductor package after attachment to a carrier, according to another embodiment.

FIG. 8 illustrates a partial side view of the molded semiconductor package 100 after attachment to the carrier 200, according to another embodiment. The embodiment shown in FIG. 8 is similar to the embodiment shown in FIG. 7. Different, however, the single groove 122a-122d in which an entire row of C-wing leads 102 is seated has an angled main surface 300 which faces the row of C-wing leads 102 and slopes inward. In one embodiment, the angled main surface 300 of the groove 122a-122d slopes inward at an angle between 10 degrees and 20 degrees with respect to the bottom main face 112a of the molded package body 108.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
   a molded package body having a bottom main face, a top main face and side faces extending from the bottom main face to the top main face,
   a semiconductor die embedded in the molded package body;
   a first plurality of leads electrically connected to the semiconductor die and protruding from a first side face of the molded package body; and
   a first recess extending inward from the first side face of the molded package body and into the bottom main face to form a single groove along the first side face at a bottom of the package,
   wherein the first recess begins below a region of the first side face from which the first plurality of leads protrudes, so that the region of the first side face from which the first plurality of leads protrudes is flat and all leads of the first plurality of leads exit the molded package body in the same plane,
   wherein a first subset of the first plurality of leads is bent inward towards the molded package body and seated in the single groove formed by the first recess, to form a first row of leads configured for surface mounting,
   wherein a second subset of the first plurality of leads extends outward from the molded package body, to form a second row of leads configured for surface mounting.

2. The semiconductor package of claim 1, wherein the first row of leads is spaced apart from the second row of leads by a minimum distance of at least 0.8 mm.

3. The semiconductor package of claim 1, wherein the first row of leads seated in the single groove formed by the first recess has a thickness which is greater than a depth of the single groove, so that the first row of leads is not flush with the bottom main face of the molded package body, and wherein the depth of the single groove is measured in a direction perpendicular to the bottom main face.

4. The semiconductor package of claim 1, further comprising:
   a second plurality of leads electrically connected to the semiconductor die and protruding from a second side face of the molded package body adjacent the first side face; and
   a second recess extending inward from the second side face of the molded package body and into the bottom main face to form a single groove along the second side face at the bottom of the package,
   wherein the second recess begins below a region of the second side face from which the second plurality of leads protrudes, so that the region of the second side face from which the second plurality of leads protrudes is flat and all leads of the second plurality of leads exit the molded package body in the same plane,
   wherein a first subset of the second plurality of leads is bent inward towards the molded package body and seated in the single groove formed by the second recess, to form a third row of leads configured for surface mounting,
   wherein a second subset of the second plurality of leads extends outward from the molded package body, to form a fourth row of leads configured for surface mounting.

5. The semiconductor package of claim 4, wherein the third row of leads is spaced apart from the fourth row of leads by a minimum distance of at least 0.8 mm.

6. The semiconductor package of claim 4, wherein the third row of leads seated in the single groove formed by the second recess has a thickness which is greater than a depth of the single groove, so that the third row of leads is not flush with the bottom main face of the molded package body, and wherein the depth of the single groove is measured in a direction perpendicular to the bottom main face.

7. The semiconductor package of claim 4, wherein the first recess and the second recess each terminate before reaching a corner region of the molded package body which connects the first side face to the second side face, so that the bottom of the package is not recessed in the corner region.

8. The semiconductor package of claim 7, wherein the first recess is spaced apart from the second recess by a minimum distance of at least 0.5 mm in the corner region.

9. The semiconductor package of claim 6, further comprising:
   a third plurality of leads electrically connected to the semiconductor die and protruding from a third side face of the molded package body adjacent the second side face; and
   a third recess extending inward from the third side face of the molded package body and into the bottom main face to form a single groove along the third side face at the bottom of the package,
   wherein the third recess begins below a region of the third side face from which the third plurality of leads protrudes, so that the region of the third side face from which the third plurality of leads protrudes is flat and all leads of the third plurality of leads exit the molded package body in the same plane,
   wherein a first subset of the third plurality of leads is bent inward towards the molded package body and seated in the single groove formed by the third recess, to form a fifth row of leads configured for surface mounting,
   wherein a second subset of the third plurality of leads extends outward from the molded package body, to form a sixth row of leads configured for surface mounting.

10. The semiconductor package of claim 9, wherein the fifth row of leads is spaced apart from the sixth row of leads by a minimum distance of at least 0.8 mm.

11. The semiconductor package of claim 9, wherein the fifth row of leads seated in the single groove formed by the third recess has a thickness which is greater than a depth of the single groove, so that the fifth row of leads is not flush with the bottom main face of the molded package body, and wherein the depth of the single groove is measured in a direction perpendicular to the bottom main face.

12. The semiconductor package of claim 9, wherein the second recess and the third recess each terminate before reaching a corner region of the molded package body which connects the second side face to the third side face, so that the bottom of the package is not recessed in the corner region.

13. The semiconductor package of claim 12, wherein the second recess is spaced apart from the third recess by a minimum distance of at least 0.5 mm in the corner region.

14. The semiconductor package of claim 9, further comprising:
   a fourth plurality of leads electrically connected to the semiconductor die and protruding from a fourth side face of the molded package body adjacent the third side face at a first end and adjacent the first side face at a second end; and
   a fourth recess extending inward from the fourth side face of the molded package body and into the bottom main face to form a single groove along the fourth side face at the bottom of the package, wherein the fourth recess begins below a region of the fourth side face from which the fourth plurality of leads protrudes, so that the region of the fourth side face from which the fourth plurality of leads protrudes is flat and all leads of the fourth plurality of leads exit the molded package body in the same plane, wherein a first subset of the fourth plurality of leads is bent inward towards the molded package body and seated in the single groove formed by the fourth recess, to form a seventh row of leads configured for surface mounting, wherein a second subset of the fourth plurality of leads extends outward from the molded package body, to form an eighth row of leads configured for surface mounting.

15. The semiconductor package of claim 14, wherein the seventh row of leads is spaced apart from the eighth row of leads by a minimum distance of at least 0.8 mm.

16. The semiconductor package of claim 14, wherein the seventh row of leads seated in the single groove formed by the fourth recess has a thickness which is greater than a depth of the single groove, so that the seventh row of leads is not flush with the bottom main face of the molded package body, and wherein the depth of the single groove is measured in a direction perpendicular to the bottom main face.

17. The semiconductor package of claim 14, wherein the third recess and the fourth recess each terminate before reaching a corner region of the molded package body which connects the third side face to the fourth side face, so that the bottom of the package is not recessed in the corner region.

18. The semiconductor package of claim 17, wherein the third recess is spaced apart from the third side face to the fourth side face recess by a minimum distance of at least 0.5 mm in the corner region.

19. The semiconductor package of claim 1, wherein the single groove formed along the first side face at the bottom of the package has an angled main surface which faces the first row of leads and slopes inward.

20. The semiconductor package of claim 19, wherein the angled main surface of the single groove slopes inward at an angle between 10 degrees and 20 degrees with respect to the bottom main face of the molded package body.

* * * * *